(12) United States Patent
Shang

(10) Patent No.: US 9,373,414 B2
(45) Date of Patent: *Jun. 21, 2016

(54) SHIFT REGISTER UNIT AND GATE DRIVE DEVICE FOR LIQUID CRYSTAL DISPLAY

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventor: Guangliang Shang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 210 days.

This patent is subject to a terminal disclaimer.

(21) Appl. No.: 14/162,054

(22) Filed: Jan. 23, 2014

(65) Prior Publication Data

US 2014/0133621 A1    May 15, 2014

Related U.S. Application Data

(60) Continuation-in-part of application No. 14/011,006, filed on Aug. 27, 2013, now Pat. No. 8,666,019, which is a division of application No. 12/878,151, filed on Sep. 9, 2010, now Pat. No. 8,548,115.

(30) Foreign Application Priority Data

Sep. 10, 2009    (CN) .......................... 2009 1 0092899

(51) Int. Cl.
*G11C 19/00*    (2006.01)
*G11C 19/28*    (2006.01)
(Continued)

(52) U.S. Cl.
CPC .............. *G11C 19/28* (2013.01); *G11C 19/184* (2013.01); *G09G 3/3677* (2013.01); *G09G 2310/0286* (2013.01)

(58) Field of Classification Search
None
See application file for complete search history.

(56) References Cited

U.S. PATENT DOCUMENTS 5,701,136 A    12/1997    Huq et al.
5,982,217 A *  11/1999    Chen et al. .................... 327/321
(Continued)

FOREIGN PATENT DOCUMENTS

CN    1020060097819 A    9/2006
CN          1885379 A    12/2006
(Continued)

OTHER PUBLICATIONS

USPTO RR dated Apr. 9, 2013; U.S. Appl. No. 12/878,151.
(Continued)

*Primary Examiner* — Tuan T Lam
(74) *Attorney, Agent, or Firm* — Ladas & Parry LLP

(57) ABSTRACT

A shift register unit and a gate drive device for a liquid crystal display are disclosed. Both gate and drain of the tenth thin film transistor are connected to the source of the fifth thin film transistor, a source thereof is connected to a low voltage signal input terminal, threshold voltages of the eighth thin film transistor and the ninth thin film transistor are equal to or less than threshold voltage of the tenth thin film transistor. The shift register unit and the gate drive device for liquid crystal display provided in the present invention, could enable the thin film transistor used to suppress the noise in the shift register unit to maintain turning on, therefore it guarantees the reliability of the shift register unit.

19 Claims, 11 Drawing Sheets

(51) Int. Cl.
*G11C 19/18* (2006.01)
*G09G 3/36* (2006.01)

(56) References Cited

U.S. PATENT DOCUMENTS

| | | | |
|---|---|---|---|
| 6,351,171 B1 * | 2/2002 | Balhiser | 327/318 |
| 6,400,204 B1 * | 6/2002 | Davis | 327/314 |
| 7,764,761 B2 * | 7/2010 | Shih et al. | 377/64 |
| 7,907,696 B2 | 3/2011 | Chen et al. | |
| 8,081,731 B2 | 12/2011 | Lin et al. | |
| 2007/0040792 A1 | 2/2007 | Kwag et al. | |
| 2007/0217563 A1 * | 9/2007 | Chang et al. | 377/64 |
| 2008/0036725 A1 | 2/2008 | Lee et al. | |
| 2008/0055225 A1 | 3/2008 | Pak et al. | |
| 2008/0056430 A1 * | 3/2008 | Chang et al. | 377/64 |
| 2009/0304138 A1 | 12/2009 | Tsai et al. | |
| 2010/0245300 A1 | 9/2010 | Chan et al. | |
| 2011/0002437 A1 | 1/2011 | Su et al. | |
| 2011/0058640 A1 * | 3/2011 | Shang et al. | 377/64 |
| 2011/0286572 A1 * | 11/2011 | Shang et al. | 377/67 |
| 2012/0087460 A1 * | 4/2012 | Moriwaki | 377/64 |
| 2012/0113088 A1 | 5/2012 | Han et al. | |
| 2012/0262438 A1 * | 10/2012 | Shang et al. | 345/211 |
| 2012/0268849 A1 * | 10/2012 | Tomatsu | 361/56 |
| 2013/0044397 A1 * | 2/2013 | Tsai et al. | 361/56 |
| 2013/0285730 A1 * | 10/2013 | Huang et al. | 327/321 |
| 2013/0342516 A1 * | 12/2013 | Shang | 345/206 |
| 2014/0177780 A1 * | 6/2014 | Qi et al. | 377/64 |

FOREIGN PATENT DOCUMENTS

| | | |
|---|---|---|
| CN | 101122720 A | 2/2008 |
| CN | 101136185 A | 3/2008 |

OTHER PUBLICATIONS

USPTO Notice of Allowability May 15, 2013; U.S. Appl. No. 12/878,151.
USPTO NOA mailed Oct. 21, 2013; U.S. Appl. No. 14/011,006.

* cited by examiner

SHIFT REGISTER UNIT AND GATE DRIVE DEVICE FOR LIQUID CRYSTAL DISPLAY

BACKGROUND

The embodiments of present invention relates to a field for a liquid crystal display, in particular to a shift register unit and a gate drive device for the liquid crystal display.

A shift register unit in the prior art includes a signal output terminal outputting a gate drive signal. When the gate drive signal is at high level, the shift register unit controls a row of thin film transistors to be turned on; when the gate drive signal is at low level, the shift register unit controls a row of thin film transistors to be turned off.

The liquid crystal display generally utilizes a scan manner of row by row, when scanning a certain row, the corresponding shift register unit outputs a gate drive signal with high level, the remaining shift register units output a gate drive signal with low level, it is obvious that, for a shift register unit, the gate drive signal is at low level for the most time.

During the time that the gate drive signal is at low level, the gate drive signal would be easily suffer the interference of an inputted clock signal and than produce noise. In order to suppress the noise, the shift register unit normally includes a pull-down thin film transistor which is used to pull down the gate drive signal during the gate drive signal is at low level. A node connected to a gate of the pull-down thin film transistor controls the pull-down thin film transistor to be turned on, such that it can pull down the level of the gate drive signal at the signal output terminal.

The existing problems of the shift register unit in the prior art are: usually the node connected to the gate of the pull-down thin film transistor maintains high level at most time, in this way the pull-down thin film transistor maintains turning on at most time, such that it makes a threshold voltage of the pull-down thin film transistor subjected to a large offset. If the threshold voltage of the pull-down thin film transistor keeps increasing, then it would cause the pull-down thin film transistor unable to be turned on, thereby unable to make the contribution of suppressing the noise, and then the performance of the whole shift register unit would be affected.

SUMMARY

The embodiments of present invention provide a shift register unit and a gate drive device for the liquid crystal display capable of making the thin film transistor used to suppressing the noise in the shift register unit maintain turning on, so as to guarantee the reliability of the shift register unit.

An embodiment of the present invention provides a shift register unit, comprising:

a third thin film transistor for controlling a level at a pull-up node under a control of a first control signal;

a first thin film transistor for outputting a first clock signal to a signal output terminal under a control of a level at the pull-up node;

a control unit for controlling a level at a pull-down node;

a second level output unit for outputting a second level signal to the signal output terminal under a control of the level at the pull-down node;

a tenth thin film transistor for inputting a first level signal to the pull-down node under a control of the level at the pull-down node; and an eleventh thin film transistor for inputting a first level signal to the pull-down node under a control of a level at the signal output terminal Optionally, wherein the first thin film transistor, has a drain connected to a first clock signal input terminal, a source connected to a signal output terminal;

a second thin film transistor, has a drain connected to the source of the first thin film transistor, a gate connected to a reset signal input terminal, a source connected to a low voltage signal input terminal;

a third thin film transistor, has a drain and a gate both connected to a signal input terminal, a source connected to the gate of the first thin film transistor;

a fourth thin film transistor, has a drain connected to the source of the third thin film transistor, a gate connected to the reset signal input terminal, a source connected to the low voltage signal input terminal;

a fifth thin film transistor, has a drain connected to a high voltage signal input terminal, a gate connected to the reset signal input terminal;

a sixth thin film transistor, has a drain connected to the source of the fifth thin film transistor, a gate connected to the source of the third thin film transistor, a source connected to the low voltage signal input terminal;

a seventh thin film transistor, has a drain connected to the high voltage signal input terminal, a gate connected to a frame start signal input terminal, a source connected to the drain of the sixth thin film transistor;

an eighth thin film transistor, has a drain connected to the source of the first thin film transistor, a source connected to the low voltage signal input terminal, a gate connected to the source of the fifth thin film transistor, a ninth thin film transistor, has a drain connected to the source of the third thin film transistor, a gate connected to the source of the fifth thin film transistor, a source connected to the low voltage signal input terminal; and a tenth thin film transistor, has a drain and a gate both connected to the source of the fifth thin film transistor, a source connected to the low voltage signal input terminal;

wherein threshold voltages of the eighth thin film transistor and the ninth thin film transistor are equal to or less than threshold voltage of the tenth thin film transistor.

Another embodiment of the present invention also provides a gate drive device for liquid crystal display, comprising a plurality of shift register units defined as above, deposited on an array substrate of the liquid crystal display;

except for a first shift register unit and a last shift register unit, the signal output terminal of each of the rest of the shift register units is connected to a signal input terminal of a next adjacent shift register unit and to a reset signal input terminal of a previous adjacent shift register unit, a signal output terminal of the first shift register unit is connected to a signal input terminal of a second shift register unit, a signal output terminal of the last shift register unit is connected to a reset signal input terminal of a previous adjacent shift register unit and the reset signal input terminal itself;

a signal input terminal of the first shift register unit inputs a frame start signal;

the first clock signal input terminal of the odd-numbered shift register unit inputs a first clock signal; the first clock signal input terminal of the even-numbered shift register unit inputs a second clock signal;

a low voltage signal input terminal of each shift register unit inputs a low voltage signal; and a high voltage signal input terminal of each shift register unit inputs a high voltage signal.

Another embodiment of the present invention also provides a shift register unit, comprising:

a first thin film transistor, whose drain is connected to a first clock signal input terminal, a source thereof is connected to a signal output terminal;

a second thin film transistor, whose drain is connected to the source of the first thin film transistor, a gate thereof is connected to a reset signal input terminal, a source thereof is connected to a low voltage signal input terminal;

a third thin film transistor, whose drain and gate are both connected to a signal input terminal, a source thereof is connected to the gate of the first thin film transistor;

a fourth thin film transistor, whose drain is connected to the source of the third thin film transistor, a gate thereof is connected to the reset signal input terminal, a source thereof is connected to the low voltage signal input terminal;

a fifth thin film transistor, whose drain is connected to a high voltage signal input terminal, a gate thereof is connected to the reset signal input terminal;

a sixth thin film transistor, whose drain is connected to the source of the fifth thin film transistor, a gate thereof is connected to the signal input terminal, a source thereof is connected to the low voltage signal input terminal;

a seventh thin film transistor, whose drain is connected to the high voltage signal input terminal, a gate thereof is connected to a frame start signal input terminal, a source thereof is connected to the drain of the sixth thin film transistor;

a eighth thin film transistor, whose drain is connected to the source of the first thin film transistor, a source thereof is connected to the low voltage signal input terminal, a gate thereof is connected to the source of the fifth thin film transistor, a ninth thin film transistor, whose drain is connected to the source of the third thin film transistor, a gate thereof is connected to the source of the fifth thin film transistor, a source thereof is connected to the low voltage signal input terminal;

a tenth thin film transistor, whose drain and gate are both connected to the source of the fifth thin film transistor, a source thereof is connected to the low voltage signal input terminal; and a eleventh thin film transistor, whose drain is connected to the source of the fifth thin film transistor, a source thereof is connected to the low voltage signal input terminal, a gate thereof is connected to the signal output terminal;

wherein threshold voltages of the eighth thin film transistor and the ninth thin film transistor are equal to or less than threshold voltage of the tenth thin film transistor.

Still another embodiment of the present invention provides a gate drive device for liquid crystal display, comprising a plurality of shift register units defined as above, deposited on an array substrate of the liquid crystal display;

except for a first shift register unit and a last shift register unit, the signal output terminal of each of the rest of the shift register units is connected to a signal input terminal of a next adjacent shift register unit and a reset signal input terminal of a previous adjacent shift register unit, a signal output terminal of the first shift register unit is connected to a signal input terminal of a second shift register unit, a signal output terminal of the last shift register unit is connected to a reset signal input terminal of a previous adjacent shift register unit and the reset signal input terminal of itself;

a signal input terminal of the first shift register unit inputs a frame start signal;

the first clock signal input terminal of the odd-numbered shift register unit inputs a first clock signal; the first clock signal input terminal of the even-numbered shift register unit inputs a second clock signal;

a low voltage signal input terminal of each shift register unit inputs a low voltage signal; and a high voltage signal input terminal of each shift register unit inputs a high voltage signal.

In the shift register unit and the gate drive device for liquid crystal display provided in the embodiments of the present invention, when the threshold voltages of the eighth thin film transistor and the ninth thin film transistor increase, the voltages applied on the gate electrodes of the eighth thin film transistor and the ninth thin film transistor also increase, such that it can enable the eighth thin film transistor and the ninth thin film transistor used to suppress the noise in the shift register unit to maintain turning on, therefore it guarantees the reliability of the shift register unit.

A further detailed description of the embodiments of the present invention is made below by the certain embodiments in connection with figures.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 1b illustrates a timing diagram of the input and output of the shift register unit of FIG. 1a;

FIG. 2b illustrates a timing diagram of the input and output of the shift register unit of FIG. 2a;

FIG. 4b illustrates a timing diagram of the input and output of the shift register unit of FIG. 4a;

FIG. 7b illustrates a timing diagram of the input and output of the gate drive device for the liquid crystal display of FIG. 7a.

DETAILED DESCRIPTION

Figure 1A:
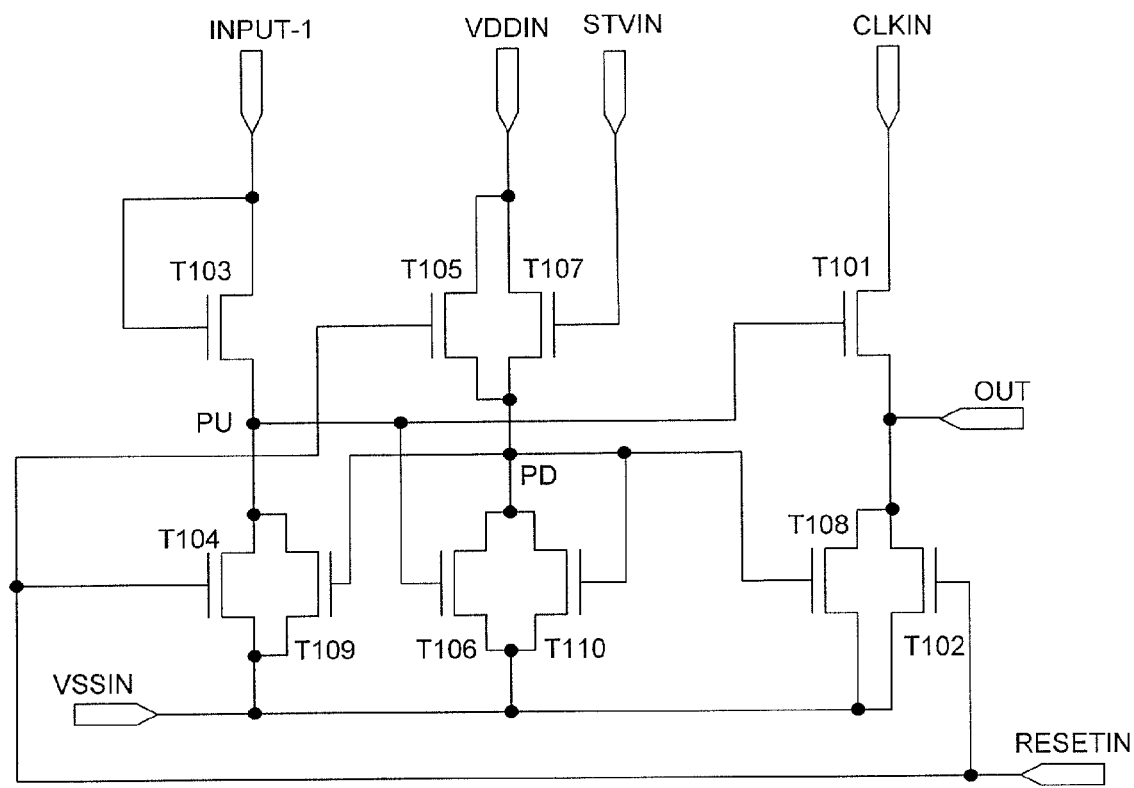
FIG. 1a illustrates a schematic diagram of a structure of the shift register unit of an embodiment of the present invention.

FIG. 1a illustrates a schematic diagram of a structure of the shift register unit of an embodiment of the present invention, the shift register unit comprises: a first thin film transistor T101, a second thin film transistor T102, a third thin film transistor T103, a fourth thin film transistor T104, a fifth thin film transistor T105, a sixth thin film transistor T106, a seventh thin film transistor T107, a eighth thin film transistor T108, a ninth thin film transistor T109, and a tenth thin film transistor T110. A drain of the first thin film transistor T101 is connected to a first clock signal input terminal (CLKIN), a source thereof is connected to a signal output terminal (OUTPUT); a drain of the second thin film transistor T102 is connected to the source of T101, a gate thereof is connected to a reset signal input terminal (RESETIN), a source thereof is connected to a low voltage signal input terminal (VSSIN); a drain and a gate of the third thin film transistor T103 are both connected to a signal input terminal (INPUT-1), a source thereof is connected to the gate of the first thin film transistor T101; a drain of the fourth thin film transistor T104 is connected to the source of the third thin film transistor T103, a gate thereof is connected to the reset signal input terminal (RESETIN), a source thereof is connected to the low voltage signal input terminal (VSSIN); a drain of the fifth thin film transistor T105 is connected to a high voltage signal input terminal (VDDIN), a gate thereof is connected to the reset signal input terminal (RESETIN); a drain of the sixth thin film transistor T106 is connected to the source of the fifth thin film transistor T105, a gate thereof is connected to the source of the third thin film transistor T103, a source thereof is connected to the low voltage signal input terminal (VSSIN); a drain of the seventh thin film transistor T107 is connected to the high voltage signal input terminal (VDDIN), a gate thereof is connected to a frame start signal input terminal (STVIN), a source thereof is connected to the drain of the sixth thin film transistor T106; a gate of the eighth thin film transistor T108 is connected to the source of the fifth thin film transistor T105, a drain thereof is connected to the source of the first thin film transistor T101, a source thereof is connected to the low voltage signal input terminal (VSSIN); a drain of the ninth thin film transistor T109 is connected to the source of the third thin film transistor T103, a gate thereof is connected to the source of the fifth thin film transistor T105, a source thereof is connected to the low voltage signal input terminal (VSSIN); a drain and a gate of the tenth thin film transistor T110 are both connected to the source of the fifth thin film transistor T105, a source thereof is connected to the low voltage signal input terminal (VSSIN). The connection node for the source of the fifth thin film transistor T105, the drain of the sixth thin film transistor T106, the gate of the ninth thin film transistor T109, the gate of the tenth thin film transistor T110 and the gate of the eighth thin film transistor T108 is PD node. The connection node for the source of the third thin film transistor T103 and the gate of the sixth thin film transistor T106 is PU node. Among each embodiment of the present invention, the eighth thin film transistor T108 and the ninth thin film transistor T109 are pull-down thin film transistors used to suppress the noise, and the PD node is a node connected to the pull-down thin film transistor.

It should be noted that, as for the thin film transistor in the field of liquid crystal display, there is no substantial difference between the drain and the source, thus the source of the thin film transistor mentioned in the embodiment of the present invention could be the drain of the thin film transistor, while the drain of the thin film transistor also could be the source of the thin film transistor.

Figure 1B:
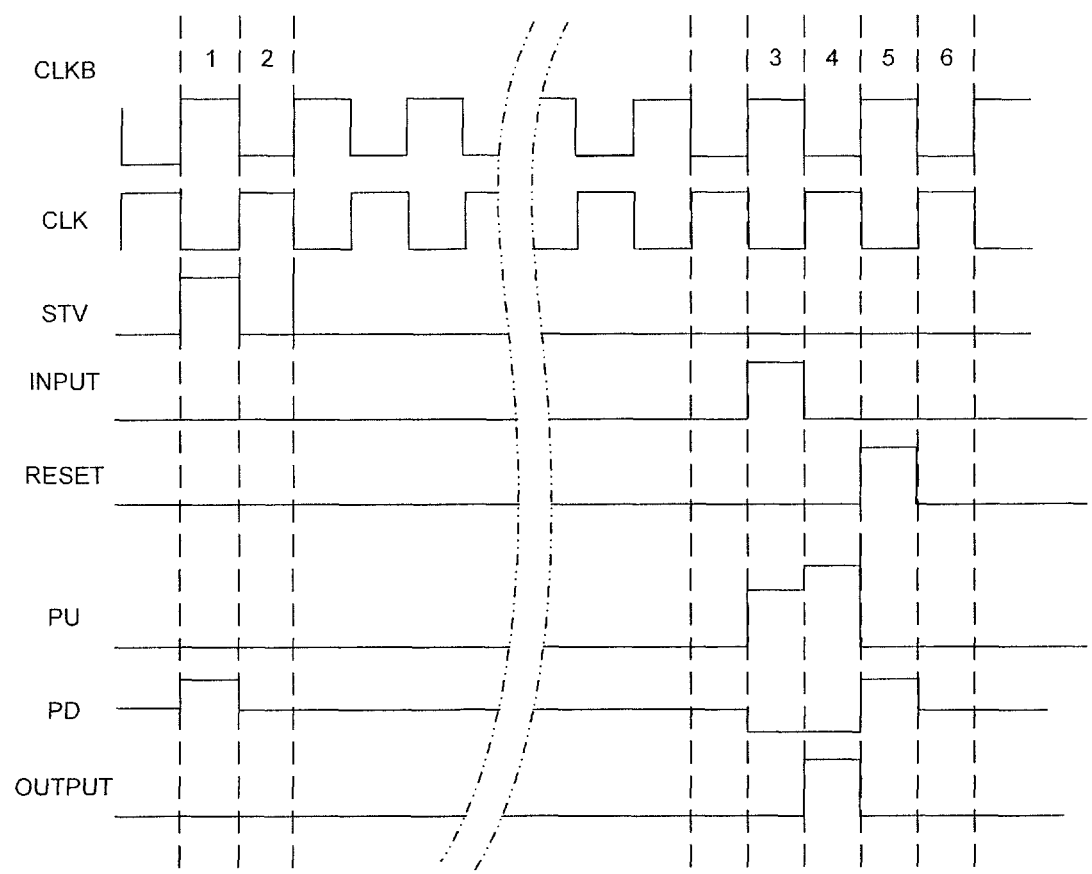

FIG. 1b illustrates a timing diagram of the input and output of the shift register unit of FIG. 1a. The gate drive device for the liquid crystal display usually includes a plurality of shift register units, a first clock signal input terminal (CLKIN) of the odd-numbered shift register unit is inputted a first clock signal (CLK), a second clock signal (CLKB) is inputted to a first clock signal input terminal (CLKIN) of the even-numbered shift register unit, a frame start signal (STV) is inputted to a signal input terminal (INPUT-1) of the first shift register unit, the signal input terminal (INPUT-1) of the rest of the shift register units is inputted a output signal of a adjacent shift register unit of the previous stage, the frame start signal input terminal (STVIN) of each shift register unit is all inputted a frame start signal (STV), PD is a signal at PD node, PU is a signal at PU node, OUTPUT is a output signal of the shift register unit, RESET is a reset signal, the reset signal (RESET) is inputted into a reset signal input terminal (RESETIN), a high voltage signal (VDD) is inputted into a high voltage signal input terminal (VDDIN), a low voltage signal (VSS) is inputted into a low voltage signal input terminal (VSSIN). The high voltage signal (VDD) is a signal which always keeps high level, while the low voltage signal (VSS) is a signal which always keeps low level, both of them are not shown in FIG. 1b.

The operation principle of the shift register unit of an embodiment of the present invention is illustrated below in connection with FIG. 1a and FIG. 1b.

A part of the timing diagram shown in FIG. 1b is selected and is divided into six stages, in the first stage, the signal at PU node is at low level, the input signal (RESET) of the reset signal input terminal (RESETIN) is at low level, the fifth thin film transistor T105 and the sixth thin film transistor T106 are turned off, the output signal (OUTPUT) of the signal output terminal (OUT) is at low level. The input signal (STV) of the frame start signal input terminal (STVIN) is at high level, the seventh thin film transistor T107 is turned on and charge to the PD node, then the voltage of the PD node increases. When the size ratio between the seventh thin film transistor T107 and the tenth thin film transistor T110 meets the requirement, it is possible to make the PD node at high level.

In the second stage, the PU node is at low level, the frame start signal (STV) is at low level, the reset signal (RESET) is also low level, the fifth thin film transistor T105, the sixth thin film transistor T106 and the seventh thin film transistor T107 are turned off, the output signal (OUTPUT) at the signal output terminal (OUT) is at low level. The tenth thin film transistor T110 is turned on under the effect of the high level of PD node, the high level of PD node is released through the tenth thin film transistor T110, until the voltage at the PD node is equal to a threshold voltage of the tenth thin film transistor T110. In this way, the eighth thin film transistor T108 and the ninth thin film transistor T109 suffer a bias voltage which is equal to or slightly higher than respective threshold voltage thereof. When fabricating the shift register unit, it should make the threshold voltage of the eighth thin film transistor T108 and the ninth thin film transistor T109 equal to or less than the threshold voltage of the tenth thin film transistor T110, at the same bias effect, the threshold voltage offsets of the eighth thin film transistor T108, the ninth thin film transistor T109 and the tenth thin film transistor T110 can maintain the same. When the threshold voltage of the eighth thin film transistor T108, the ninth thin film transistor T109 and the tenth thin film transistor T110 arise, the voltage at the PD node increases accordingly, which could make sure the eighth thin film transistor T108 and the ninth thin film transistor T109 being turned on.

In the third stage, the signal (INPUT) inputted from the signal input terminal (INPUT-1) is at high level, the third thin film transistor T103 is turned on, PU node is at high level, the first thin film transistor T101 and the sixth thin film transistor T106 are turned on, since the source of the sixth thin film transistor T106 is connected to the low voltage signal input terminal (VSSIN), the PD node becomes low level. When the PD node becomes low level, the eighth thin film transistor T108 and the ninth thin film transistor T109 are turned off. The reset signal (RESET) and the frame start signal (STV) are low level, the fifth thin film transistor T105 and the seventh thin film transistor T107 are turned off. The reset signal (RESET) is at low level, the second thin film transistor T102 and the fourth thin film transistor T104 are turned off. Since the first clock signal (CLK) is at low level, the signal (OUTPUT) outputted from the signal output terminal (OUT) is at low level.

In the fourth stage, the input signal (INPUT) of the signal input terminal (INPUT-1) is at low level, the third thin film transistor T103 is turned off. The reset signal (RESET) is at low level, the second thin film transistor T102, the fourth thin film transistor T104 and the fifth thin film transistor T105 are turned off, therefore the PU node maintains high level, the first thin film transistor T101 and the sixth thin film transistor T106 maintain turning on. The frame start signal (STV) is at low level, the seventh thin film transistor T107 is turned off, PD node maintains low level, the eighth thin film transistor T108 and the ninth thin film transistor T109 are turned off. The first clock signal (CLK) becomes high level, so the signal (OUTPUT) outputted from the signal output terminal (OUT) is at high level.

In the fifth stage, the signal (INPUT) inputted from the signal input terminal (INPUT-1) is at low level, the third thin film transistor T103 is turned off. The reset signal (RESET) is at high level, the second thin film transistor T102 and the fourth thin film transistor T104 are turned on. Because the sources of the second thin film transistor T102 and the fourth thin film transistor T104 are connected to the low voltage signal input terminal (VSSIN), the PU node becomes low level, the first thin film transistor T101 and the sixth thin film transistor T106 are turned off. The frame start signal (STV) is at low level, the seventh thin film transistor T107 is turned off. The reset signal (RESET) is at high level, the fifth thin film transistor T105 is turned on. Because the drain of the fifth thin film transistor T105 is connected to the high voltage signal input terminal (VDDIN), the sixth thin film transistor T106 is turned off, then the PD node becomes high level, the eighth thin film transistor T108 and the ninth thin film transistor T109 are turned on. Since the source of the eighth thin film transistor T108 is connected to the low voltage signal input terminal (VSSIN), so the signal (OUTPUT) outputted from the signal output terminal (OUT) is at low level.

In the sixth stage, the signal (INPUT) inputted from the signal input terminal (INPUT-1) is at low level, the third thin film transistor T103 is turned off, PU node is maintained at low level, the first thin film transistor T101 and the sixth thin film transistor T106 are turned off. The reset signal (RESET) is at low level, the fifth thin film transistor T105 is turned off. The frame start signal (STV) is at low level, the seventh thin film transistor T107 is turned off. Since the fifth thin film transistor T105 and the seventh thin film transistor T107 are turned off, the PD node maintains high level, the tenth thin film transistor T110 is turned on, PD node releases the voltage through the tenth thin film transistor T110, and the voltage of the PD node drops, until the voltage at the PD node is equal to the threshold voltage of the tenth thin film transistor T110. The eighth thin film transistor T108 and the ninth thin film transistor T109 suffer a bias voltage which is equal to or higher than respective threshold voltage. Since the source of the eighth thin film transistor T108 is connected to the low voltage signal input terminal (VSSIN), the signal (OUTPUT) outputted from the signal output terminal (OUT) is at low level.

Among above six stages, in the third stage, the signal input terminal (INPUT-1) inputs high level, in the fourth stage the signal output terminal (OUT) outputs high level, by which a shift is finished, in the fifth stage, the reset signal input terminal (RESETIN) is at high level, by which the reset operation is performed, it makes the signal output terminal (OUT) outputs low level, after the sixth stage, the signal output terminal (OUT) maintains low level output, the voltage at PD node maintains a state after the sixth stage, until the timing sequences as shown in the first stage, the second stage, the third stage, the fourth stage and the fifth stage occur again. When the shift register unit is applied to the gate drive device for the liquid crystal display, the third, fourth, fifth stage could be regarded as a working time of the shift register unit, FIG. 1b shows only part of the timing diagram of the shift register unit, whenever the liquid crystal display displays one frame image, the shift register unit controlling the liquid crystal pixels of a certain row will output a high level, the signal input terminal (INPUT-1), the reset signal input terminal (RESETIN) and the first clock signal input terminal (CLKIN) will repeat once the input timing sequence of the third stage, the fourth stage and the fifth stage.

Figure 2A:
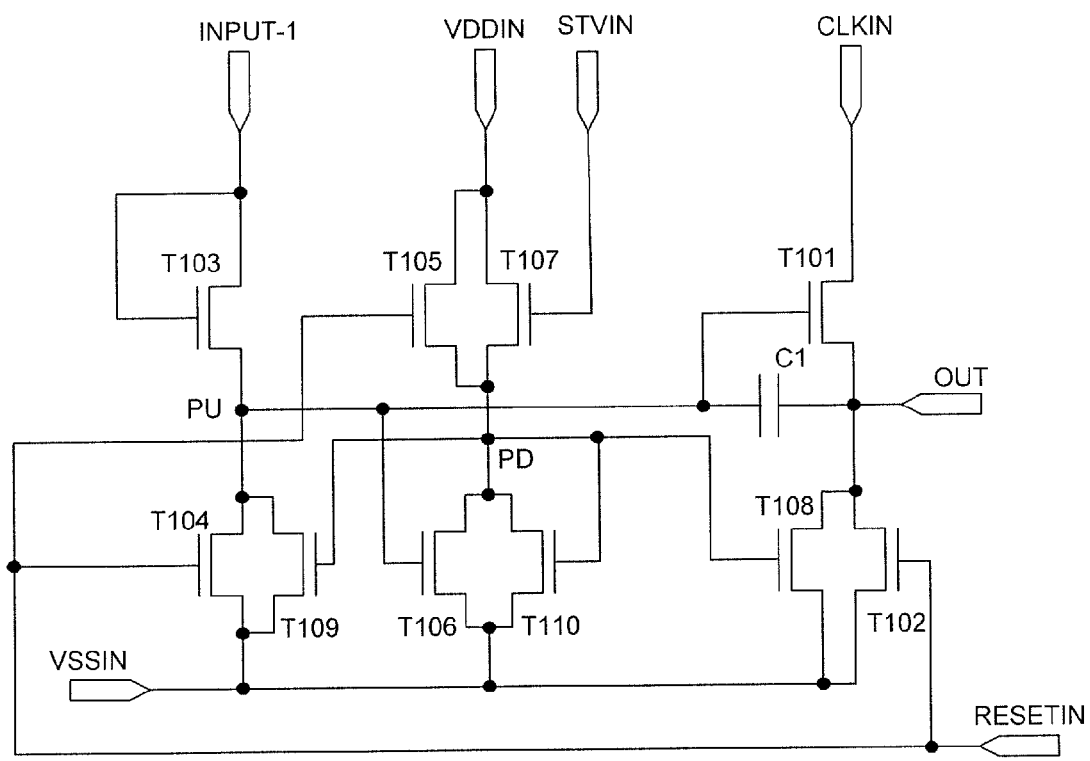
FIG. 2a illustrates a schematic diagram of a structure of the shift register unit according to a first embodiment of the presenting invention.
Figure 2B:
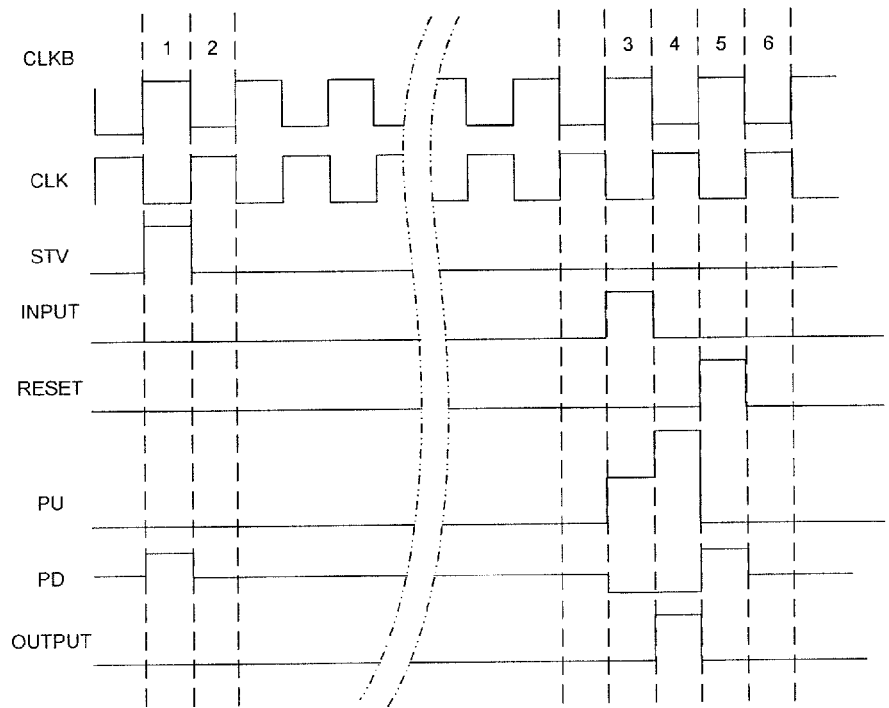

FIG. 2a illustrates a schematic diagram of a structure of the shift register unit according to a first embodiment of the presenting invention; FIG. 2b illustrates a timing diagram of the input and output of the shift register unit of FIG. 2a. The embodiment shown in FIG. 2a adds a first capacitor C1 on the basis of the shift register unit shown in FIG. 1a, the two ends of the first capacitor C1 are connected to the gate of the first thin film transistor T101 and the signal output terminal (OUT) respectively. The difference between the timing diagram shown in FIG. 2b and the timing diagram shown in FIG. 1b is: in the fourth stage, the level of the signal at PU node in FIG. 2b is higher than that of FIG. 1b due to the coupling effect of the first capacitor C1.

In the embodiment of FIG. 2a, the threshold voltage of the tenth thin film transistor is equal to or higher than the threshold voltages of the eighth thin film transistor and the ninth thin film transistor, which could make sure the eighth thin film transistor and the ninth thin film transistor being turned on, it enables the eighth thin film transistor and the ninth thin film transistor to function to suppress the noise, therefore it guarantees the reliability of the shift register unit.

Figure 3:
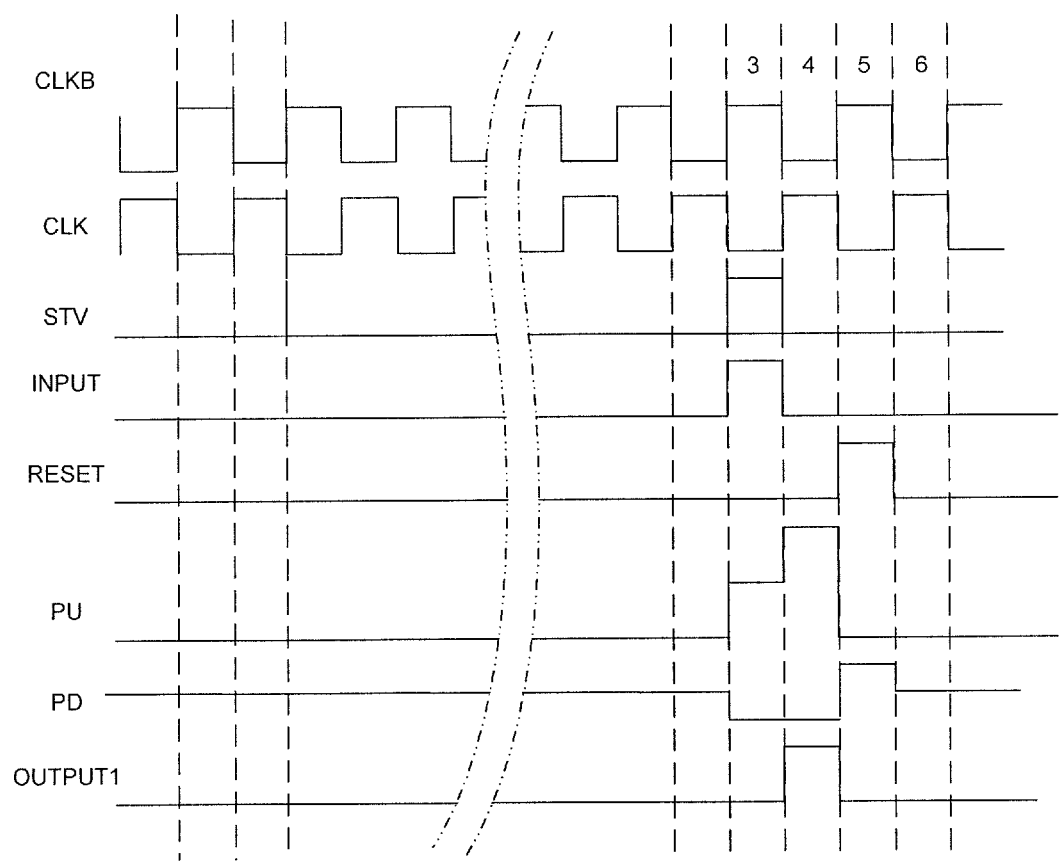
FIG. 3 illustrates a timing diagram of the input and output of the first shift register unit in the gate drive device for the liquid crystal display of an embodiment of the present invention.

As for the shift register units in the gate drive device for the liquid crystal display other than the first shift register unit, the timing sequences of input and output of the shift register units are similar to the timing diagram of FIG. 2b. As for the first shift register unit of the gate drive device for the liquid crystal display, both the frame start signal (STV) and the signal (INPUT) inputted from the signal input terminal (INPUT-1) are high level, FIG. 3 illustrates a timing diagram of the input and output of the first shift register unit in the gate drive device for the liquid crystal display of an embodiment of the present invention, as for the first shift register unit, the first stage, the second stage are overlapped with the third stage and the fourth stage respectively, it requires that the timing diagrams of the first stage and the second stage are replaced by those of the third stage and the fourth stage respectively, that is, the first stage and the second stage of FIG. 2b is not appearing.

Figure 4A:
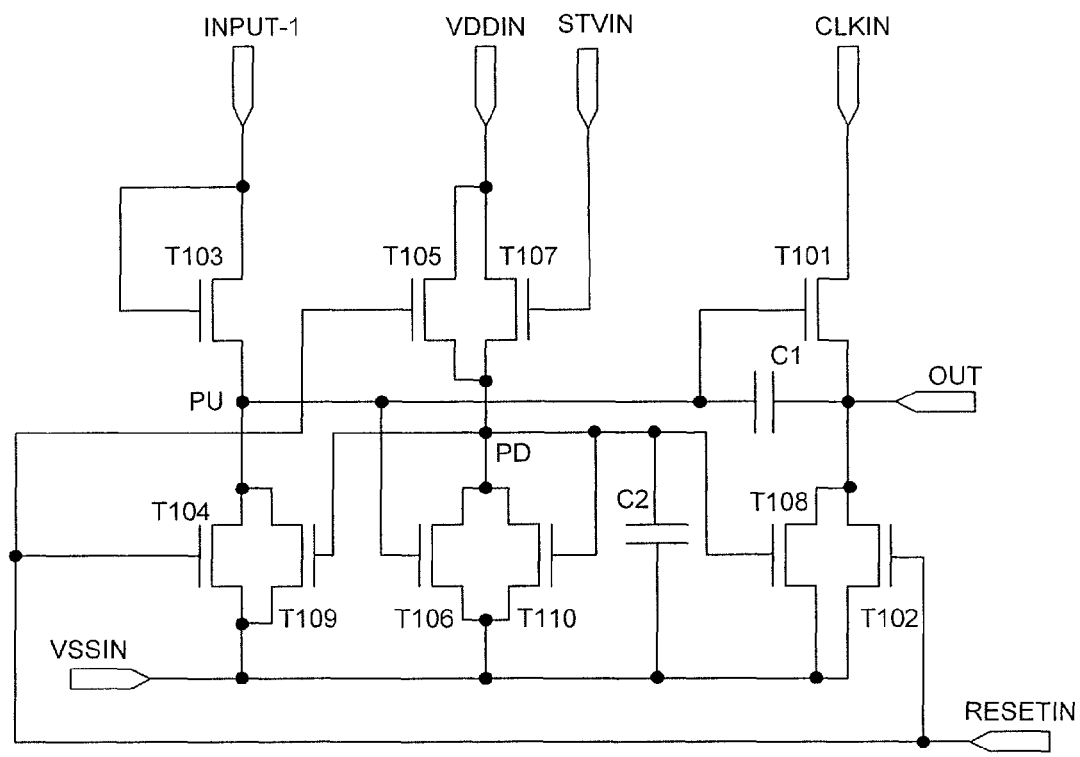
FIG. 4a illustrates a schematic diagram of a structure of the shift register unit according to a second embodiment of the presenting invention.
Figure 4B:
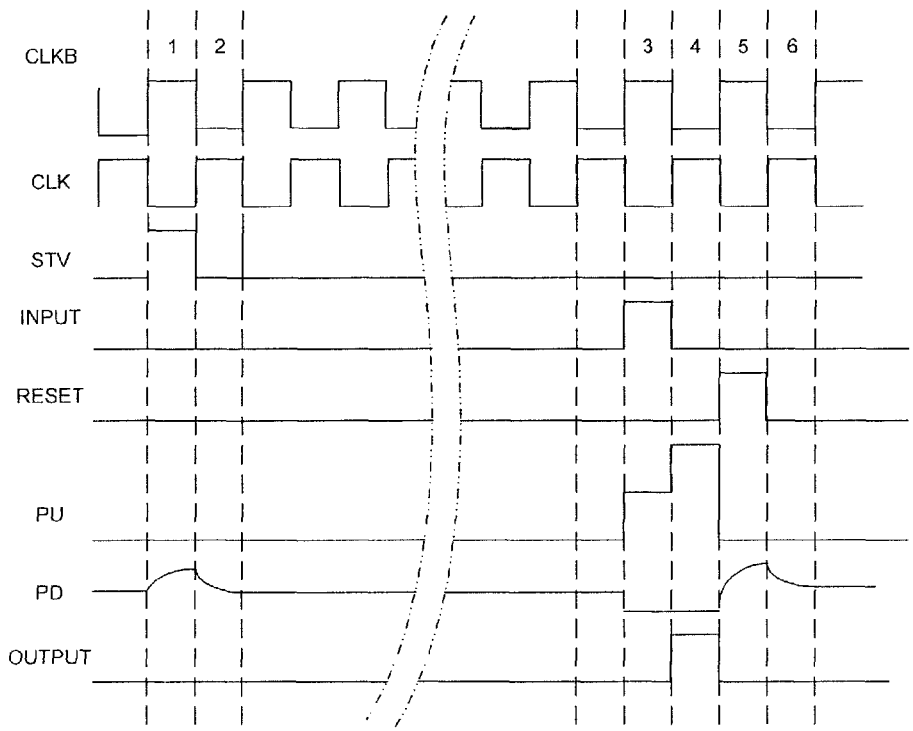

FIG. 4a illustrates a schematic diagram of a structure of the shift register unit according to a second embodiment of the presenting invention; FIG. 4b illustrates a timing diagram of the input and output of the shift register unit module of FIG. 4a. The shift register unit shown in FIG. 4a adds a second capacitor C2 on the basis of the shift register unit shown in FIG. 2a, the two ends of the second capacitor C2 are connected to the source of the fifth thin film transistor T105 and the low voltage signal input terminal (VSSIN) respectively. When the thin film transistor is turned off, the thin film transistor could be treated as a resistor, but the thin film transistor itself would produce a slight leakage, by adding the second capacitor C2, it could make the drop speed of the voltage at PD node slow down, wherein the voltage at PD node is dropped due to the leakage of the eighth thin film transistor T108, the ninth thin film transistor T109 and the tenth thin film transistor T110 which are connected to the PD node. Furthermore, as shown in FIG. 4b, because of the addition of the second capacitor, it makes the voltage at PD node in the first, fifth stages increase slowly, and makes the voltage at PD node in the second, sixth stages drop slowly.

Figure 5A:
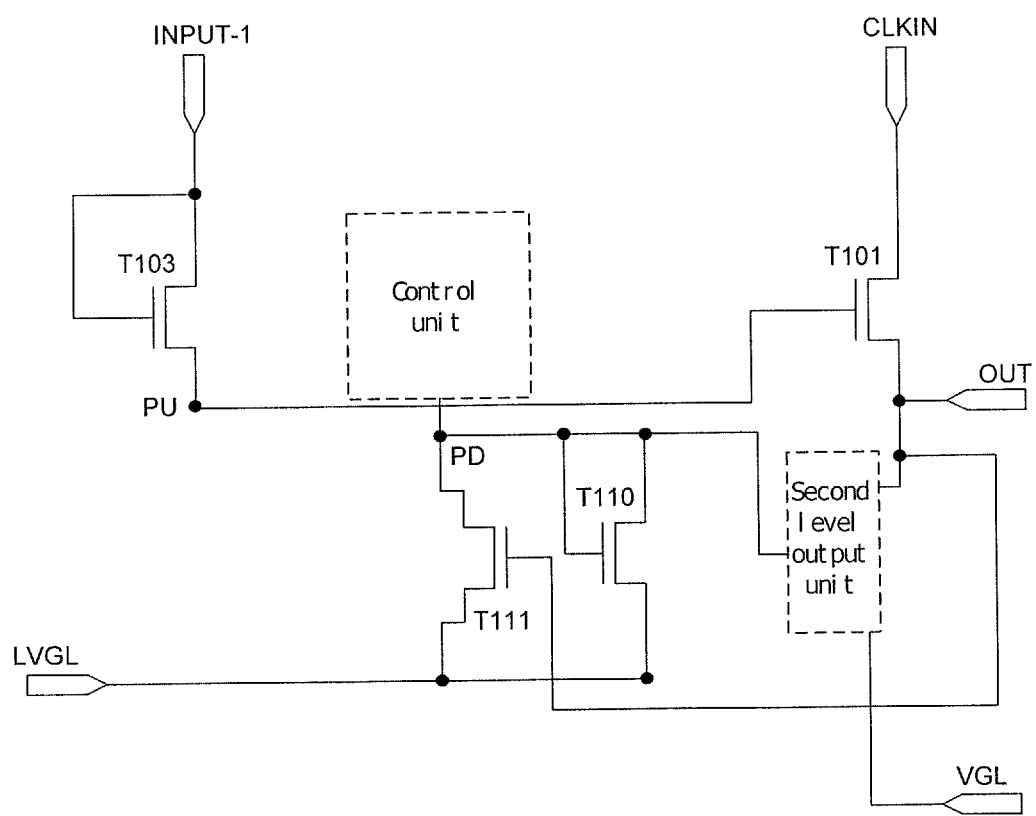
FIG. 5a illustrates a schematic diagram of a structure of a shift register unit according to a third embodiment of the presenting invention.

FIG. 5a illustrates a schematic diagram of a structure of the shift register unit according to a third embodiment of the presenting invention, wherein as shown in FIG. 5a, the shift register unit comprises: a third thin film transistor T103 for controlling a level at a pull-up node PU under a control of a first control signal; a first thin film transistor T101 for outputting a first clock signal to a signal output terminal OUT under a control of a level at the pull-up node PU; a control unit for controlling a level at a pull-down node PD; a second level output unit for outputting a second level signal to the signal output terminal OUT under a control of the level at the pull-down node PD; a tenth thin film transistor T110 for inputting a first level signal to the pull-down node PD under a control oft the level at the pull-down node PD; and an eleventh thin film transistor T111 for inputting a first level signal to the pull-down node PD under a control of a level at the signal output terminal OUT.

Figure 5B:
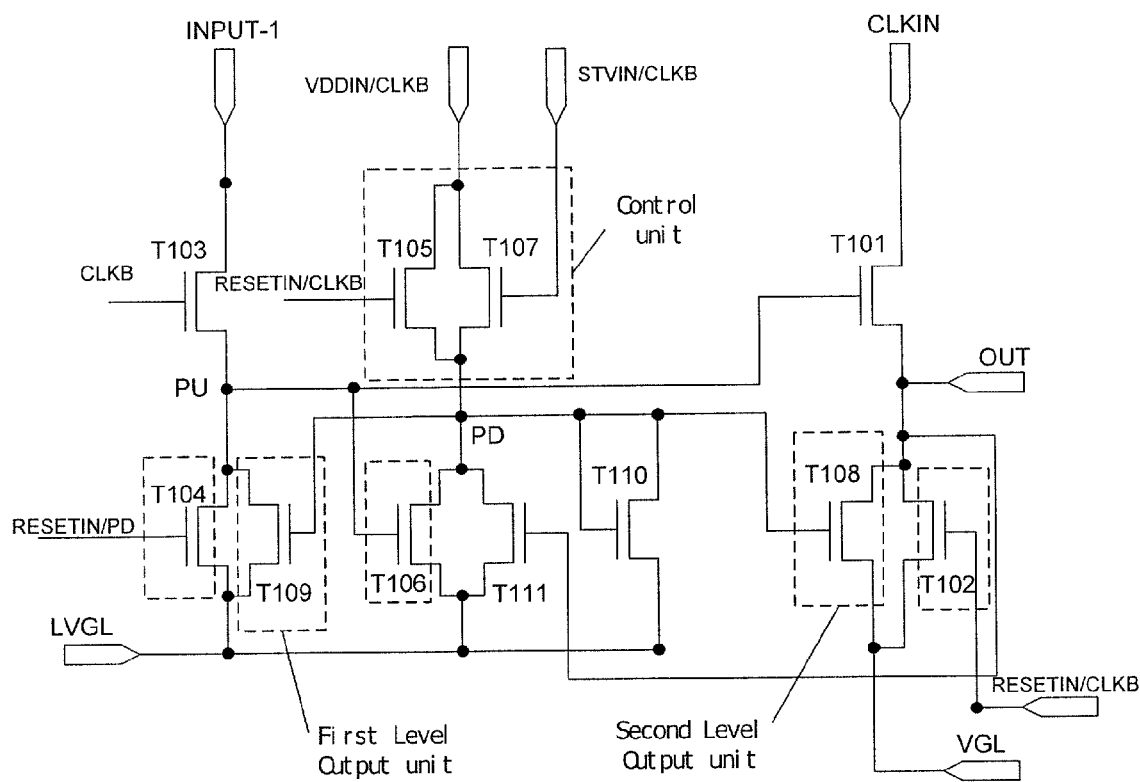
FIG. 5b illustrates a schematic diagram of a structure of a shift register unit according to a fourth embodiment of the presenting invention.
Figure 5C:
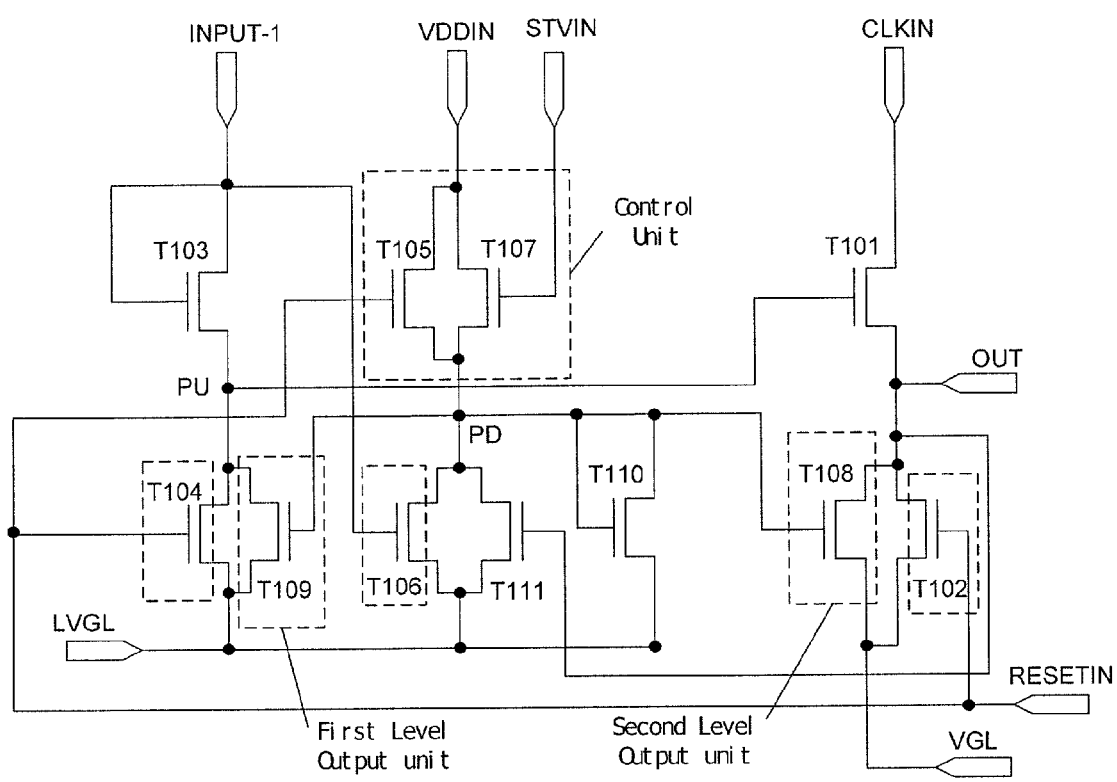
FIG. 5c illustrates a schematic diagram of a structure of a shift register unit according to a fifth embodiment of the presenting invention.

Optionally, FIGS. 5b and 5c show the schematic diagram of the structures of the shift register units according to the fourth and fifth embodiments of the present invention respectively, in the shift register units, a drain of the first thin film transistor T101 is connected to a first clock signal input terminal CLKIN, a source thereof is connected to the signal output terminal OUT, and a gate thereof is connected to the pull-up node PU; a drain of the third thin film transistor T103 is connected to a signal input terminal INPUT-1, a source thereof is connected to the pull-up node PU, and a gate thereof is connected to the signal input terminal INPUT-1 or a second clock signal input terminal CLKB; a drain and gate of the tenth thin film transistor T110 are both connected to the pull-down node PD, a source thereof is connected to a first low voltage signal input terminal LVGL; a drain of the eleventh thin film transistor T111 is connected to the pull-down node PD, a source thereof is connected to the first low voltage signal input terminal LVGL, and a gate thereof is connected to the signal output terminal OUT.

Optionally, the shift register unit further comprises a first level output unit for outputting the first level signal to the pull-up node PU under the control of the level at the pull-down node PD.

Optionally, the second level output unit comprises an eighth thin film transistor T108 having a drain connected to the signal output terminal OUT, a source connected to a second low voltage signal input terminal VGL, and a gate connected to the pull-down node PD, wherein a threshold voltage of the eighth thin film transistor is equal to or less than a threshold voltage of the tenth thin film transistor.

Optionally, the first level output unit comprises a ninth thin film transistor T109 having a drain connected to the pull-up node PU, a gate connected to the pull-down node PD, and a source connected to a first low voltage signal input terminal LVGL, wherein a threshold voltage of the ninth thin film transistor is equal to or less than a threshold voltage of the tenth thin film transistor.

Optionally, the control unit comprises: a fifth thin film transistor T105 having a drain connected to a high voltage signal input terminal VDDIN or a second clock signal input terminal CLKB, a gate connected to a reset signal input terminal RESETIN or the second clock signal input terminal CLKB, and a source connected to the pull-down node PD.

Optionally, the control unit further comprises: a seventh thin film transistor 1107 having a drain connected to a high voltage signal input terminal VDDIN or a second clock signal input terminal CLKB, a gate connected to a frame start signal input terminal STV or the second clock signal input terminal CLKB, and a source connected to the pull-down node PD.

Optionally, the control unit further comprises: a second thin film transistor T102 having a drain connected to the signal output terminal OUT, a source connected to a second low voltage signal input terminal VGL, a gate connected to a reset signal input terminal RESETIN or a second clock signal input terminal CLKB.

Optionally, the shift register unit further comprising: a fourth thin film transistor T104 having a drain connected to the pull-up node PU, a source connected to a first low voltage signal input terminal LVGL, a gate connected to a reset signal input terminal RESETIN or the pull-down node PD.

Optionally, the shift register unit further comprises: a sixth thin film transistor T106 having a drain connected to the pull-down node PD, a source connected to a first low voltage signal input terminal LVGL, a gate connected to a signal input terminal INPUT-1 or the pull-up node PU.

Optionally, the shift register unit further comprises a first capacitor C1, whose two ends are connected to a gate of the first thin film transistor T101 and the signal output terminal OUT, respectively.

Optionally, the shift register unit further comprises a second capacitor C2, whose two ends are connected to the pull-down node PD and the second low voltage signal input terminal VGL, respectively.

Optionally, when the eighth thin film transistor is a depletion mode TFT, the first level signal and the second level signal are a low level signal, the first level signal is less than the second level signal, an absolute value of a difference between the first level signal and the second level signal is larger than an absolute value of a depletion threshold voltage of the eighth thin film transistor.

Although in the above embodiments, all the Thin Film Transistors (TFTs) in the shift register unit are N type TFFs, it is possible that all the TFTs are P type TFTs, or some of them are N type TFTs and others are P type TFTs as long as levels of respective signals are adjusted accordingly. In addition, the TFTs in the shift register unit can be enhancement mode TFTs or depletion mode TFTs. For the depletion mode TFTs, the first level signal is less than the second level signal, an absolute value of a difference between the first level signal and the second level signal is larger than an absolute value of a threshold voltage of the depletion mode TFTs.

Figure 6:
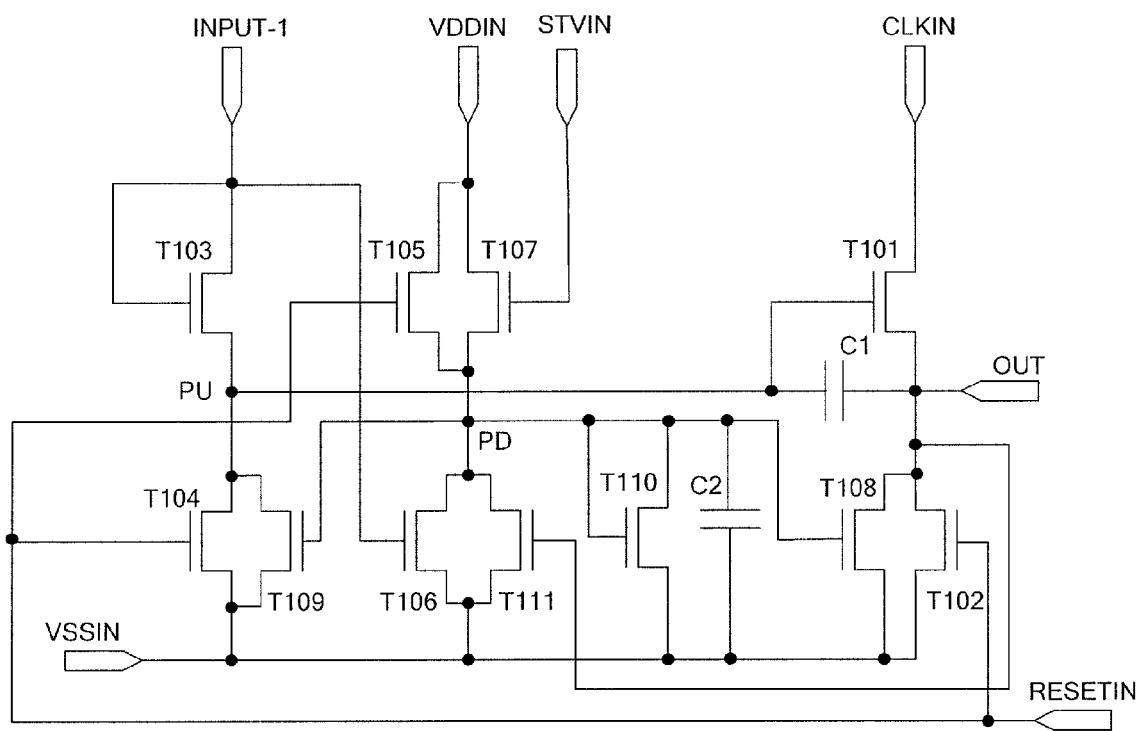
FIG. 6 illustrates a schematic diagram of a structure of the shift register unit according to a sixth embodiment of the presenting invention.

FIG. 6 shows a schematic diagram of a structure of a shift register unit according to the sixth embodiment of the present invention. The structural difference between the shift register unit shown in FIG. 6 and shown in FIG. 2a is: in FIG. 6, it adds an eleventh thin film transistor T111, a drain of the eleventh thin film transistor T111 is connected to the source of the fifth thin film transistor T105, a source thereof is connected to low voltage signal input terminal (VSSIN), the gate thereof is connected to the signal output terminal (OUT); in FIG. 6, the gate of the sixth thin film transistor T106 is connected to the signal input terminal (INPUT-1), while in FIG. 4a, the gate of the sixth thin film transistor 1106 is connected to the source of the third thin film transistor T103. By the addition of the eleventh thin film transistor T111, the shift register unit shown in FIG. 6 could quickly pull down the voltage of PD node, therefore it makes the eighth thin film transistor T108 and the ninth thin film transistor T109 to be turned off as quickly as possible, which makes the voltage of PU node becomes higher, it would benefit for cutting short the ascent time of the signal outputted from the signal output terminal (OUT). The operation principle of the shift register unit shown in FIG. 6 is similar to the operation principle of the shift register unit shown in FIG. 2a, the details of that is no longer repeated herein.

The structural difference between the shift register unit shown in FIG. 6 and that shown in FIG. 2a is further in that: the shift register unit shown in FIG. 6 adds a first capacitor C1 and a second capacitor C2, the first capacitor C1 and the second capacitor C2 in the shift register unit shown in FIG. 6 play the same role as those in the shift register unit shown in FIG. 4a.

Figure 7A:
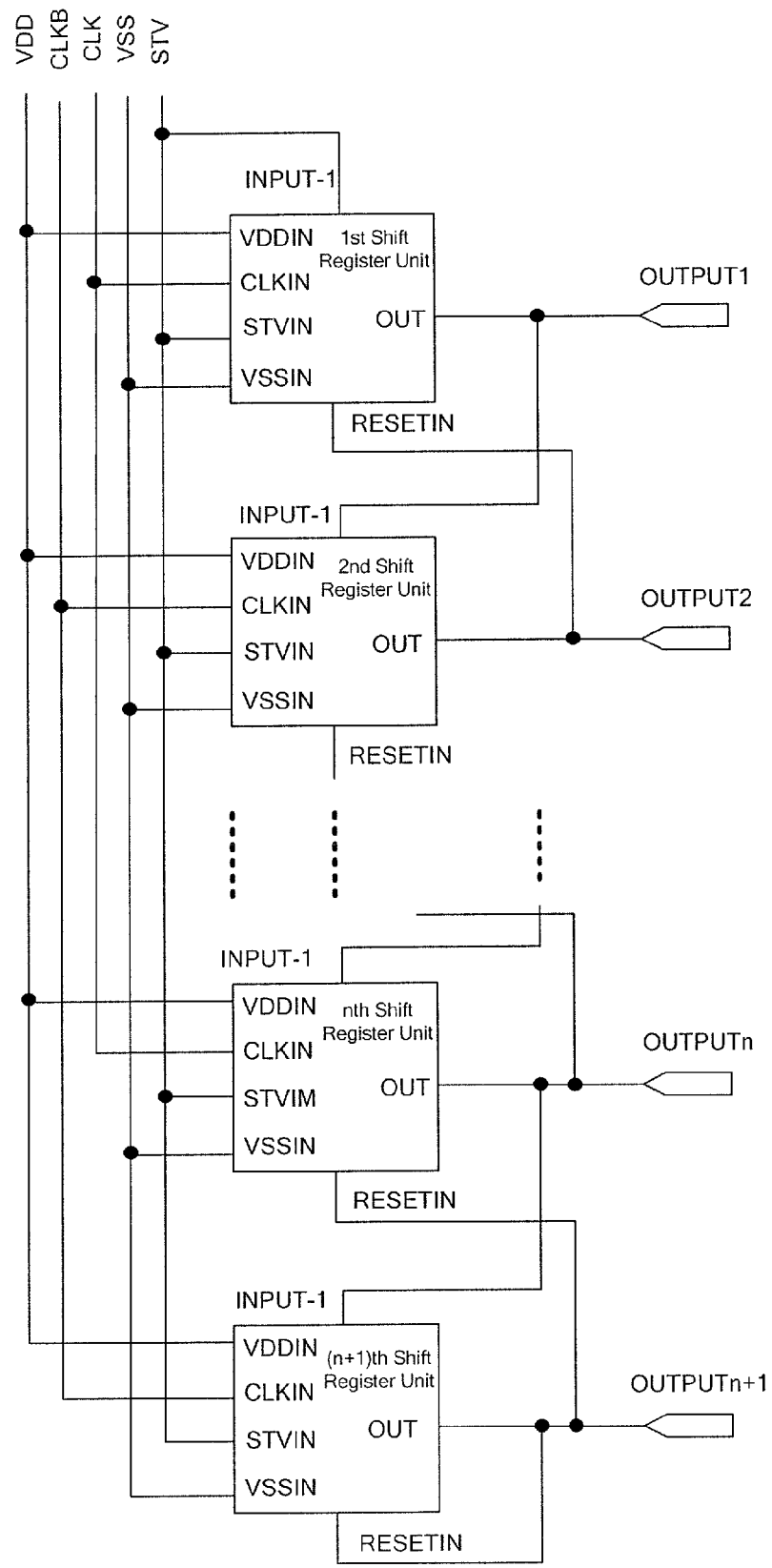
FIG. 7a illustrates a schematic diagram of a structure of the gate drive device for the liquid crystal display according to the presenting invention.
Figure 7B:
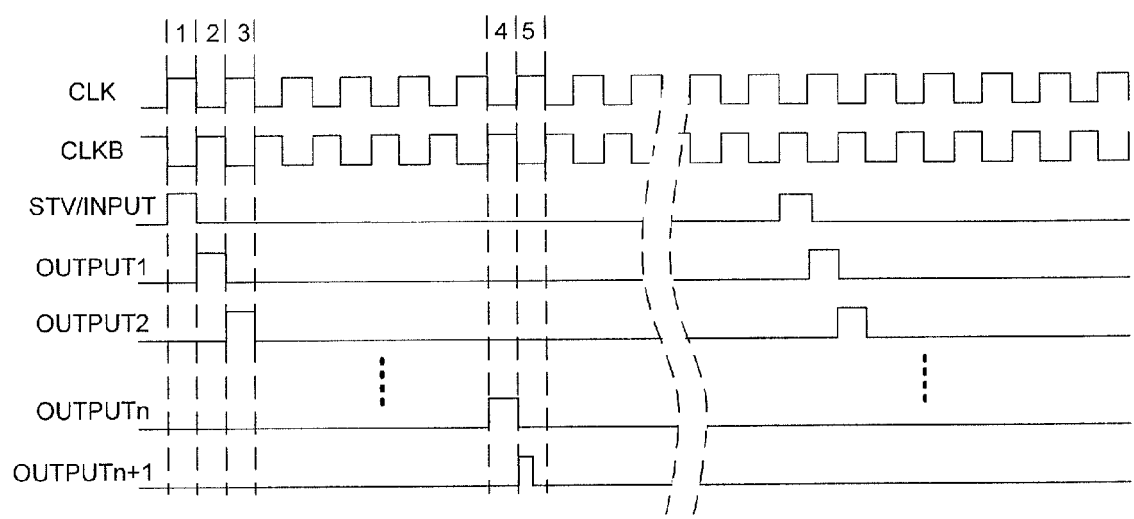

FIG. 7a illustrates a schematic diagram of a structure of the gate drive device for the liquid crystal display according to the presenting invention; FIG. 7b illustrates a timing diagram of the input and output of the gate drive device for the liquid crystal display of FIG. 7a. STV is a frame start signal, which is inputted to the signal input terminal (INPUT-1) of the first shift register unit, a high voltage signal is inputted to the high voltage signal input terminal (VDDIN) of each shift register unit, a low voltage signal is inputted to the low voltage signal input terminal (VSSIN) of each shift register unit, a first clock signal (CLK) is inputted into the first clock signal input terminal (CLKIN) of the odd numbered shift register unit, a second clock signal (CLKB) is inputted into the first clock signal input terminal (CLKIN) of the even numbered shift register unit, except for the first shift register unit and the last shift register unit, the signal output terminal of each shift register unit is all connected to the reset signal input terminal (RESETIN) of previous adjacent shift register unit and the signal input terminal (INPUT-1) of the next adjacent shift register unit, the signal output terminal (OUT) of the first shift register unit is only connected to the signal input terminal (INPUT-1) of the second shift register unit, the output terminal (OUT) of the last shift register unit (e.g. the (n+1)th shift register unit shown in FIG. 7a) is connected to the reset signal input terminal (RESETIN) of the adjacent $n^{th}$ shift register unit and the reset signal input terminal (RESETIN) of itself, respectively. The high voltage signal (VDD) and the low voltage signal (VSS) are not shown in FIG. 7b, the high voltage signal (VDD) is a signal always keeping at high level, the low voltage signal (VSS) is a signal always keeping at low level. The liquid crystal display with thin film transistor adopts a scan manner of row by row, the gates of thin film transistors connected in series with the liquid crystal pixels in the same row are all connected to the same shift register unit, the shift register unit of the gate drive device for liquid crystal display can control the turning on and off of all the thin film transistors in the same row. The particular principle of the gate drive device for liquid crystal display in FIG. 7a is: assuming there are n rows of liquid crystal pixels in the panel of the liquid crystal display, with reference to the timing diagram of FIG. 7b, in the first stage, the frame start signal is inputted to the signal input terminal (INPUT-1) of the first shift register unit; in the second stage, the signal output terminal (OUT) of the first shift register unit outputs a high level signal (OUTPUT1), at the same time the high level signal (OUTPUT1) is inputted to the signal input terminal (INPUT-1) of the second shift register unit; in the third stage, the signal output terminal (OUT) of the second shift register unit outputs a high level signal (OUTPUT2), thereafter each shift register unit sequentially outputs a high level signal, which is used to control the turning on of of the thin film transistors of the same row connected with the shift register unit, the principle is the same as that of the second and the third stage; in the fourth stage, the nth shift register unit outputs a high level signal (OUTPUTn), meanwhile the high level signal (OUTPUTn) outputted from the nth shift register unit is used as the input signal of the signal input terminal (INPUT-1) of the (n+1)th shift register unit; in the fifth stage, the (n+1)th shift register unit outputs a high level signal (OUTPUTn+1), which is not used to drive the load, that is, the (n+1)th shift register unit is not responsible for driving the thin film transistors controlling one row liquid crystal pixels, the high level signal (OUTPUTn+1) outputted therefrom is only used as the reset signal of the nth shift register unit and itself.

In FIG. 7a, the last shift register unit, i.e. the (n+1)th shift register unit is not used to driving the thin film transistor, and could be considered as a redundant shift register unit. The gate drive device of FIG. 7a only includes one redundant shift register unit, in practice, which could include more redundant shift register units, each of which could be combined to guarantee the gate drive device for liquid crystal display being reset more reliably.

The respective shift register unit of FIG. 7a could be the shift register units shown in FIG. 1a, FIG. 2a, FIG. 4a, FIGS. 5a-5c or FIG. 6.

In the shift register unit and the gate drive device for liquid crystal display provided in the embodiment of the present invention, the threshold voltage of the tenth thin film transistor is equal to or higher than the threshold voltage of the eighth thin film transistor and the ninth thin film transistor, which could make sure the eighth thin film transistor and the ninth thin film transistor being turned on, it enables the eighth thin film transistor and the ninth thin film transistor to function as pull-down thin film transistor so as to suppress the noise, therefore it guarantees the reliability of the shift register unit.

Finally, it should be noted that, the above embodiments are used only to explain the technical solution of the embodiments of the present invention, not to limit the invention; although the embodiments of the present invention has been described in details with reference to the preferred embodiments thereof, it would be obvious to those skilled in the art that he can still make variations or equal replacement to the technical solutions of the embodiments of the present invention, such variations or equal replacements are not to be regarded as rending the nature of the amended technical solutions departing from the spirit and scope of the invention.

What is claimed is:

1. A shift register unit, comprising:
a third thin film transistor for controlling a level at a pull-up node under a control of a first control signal;
a first thin film transistor for outputting a first clock signal to a signal output terminal under a control of a level at the pull-up node;
a control unit for controlling a level at a pull-down node;
a second level output unit for outputting a second level signal to the signal output terminal under a control of the level at the pull-down node;
a tenth thin film transistor having a drain and gate both connected to the pull-down node, a source connected to a first low voltage signal input terminal, for inputting a first level signal to the pull-down node under a control of the level at the pull-down node; and
an eleventh thin film transistor for inputting the first level signal to the pull-down node under a control of a level at the signal output terminal;

wherein the second level output unit comprise an eighth thin film transistor having a drain connected to the signal output terminal, a source connected to a second low voltage signal input terminal to receive a second level signal, and a gate connected to the pull-down mode, wherein the first level signal and the second level signal are low level signals, the first level signal is less than the second level signal, and an absolute value of a difference between the first level signal and the second level signal is larger than an absolute value of a depletion threshold voltage of the eighth thin film transistor.

2. The shift register unit of claim 1, wherein
a drain of the first thin film transistor is connected to a first clock signal input terminal, a source thereof is connected to the signal output terminal, and a gate thereof is connected to the pull-up node;
a drain of the third thin film transistor is connected to a signal input terminal, a source thereof is connected to the pull-up node, and a gate thereof is connected to the signal input terminal or a second clock signal input terminal;
a drain of the eleventh thin film transistor is connected to the pull-down node, a source thereof is connected to the first low voltage signal input terminal, and a gate thereof is connected to the signal output terminal.

3. The shift register unit of claim 1, further comprising a first level output unit for outputting the first level signal to the pull-up node under the control of the level at the pull-down node.

4. The shift register unit of claim 1, wherein a threshold voltage of the eighth thin film transistor is equal to or less than a threshold voltage of the tenth thin film transistor.

5. The shift register unit of claim 3, wherein the first level output unit comprises a ninth thin film transistor having a drain connected to the pull-up node, a gate connected to the pull-down node, and a source connected to the first low voltage signal input terminal, wherein a threshold voltage of the ninth thin film transistor is equal to or less than a threshold voltage of the tenth thin film transistor.

6. The shift register unit of claim 1, wherein the control unit comprises:
a fifth thin film transistor having a drain connected to a high voltage signal input terminal or a second clock signal input terminal, a gate connected to a reset signal input terminal or the second clock signal input terminal, and a source connected to the pull-down node.

7. The shift register unit of claim 1, wherein the control unit further comprises:
a seventh thin film transistor having a drain connected to a high voltage signal input terminal or a second clock signal input terminal, a gate connected to a frame start signal input terminal or the second clock signal input terminal, and a source connected to the pull-down node.

8. The shift register unit of claim 1, wherein the control unit further comprises:
a second thin film transistor having a drain connected to the signal output terminal, a source connected to a second low voltage signal input terminal, a gate connected to a reset signal input terminal or a second clock signal input terminal.

9. The shift register unit of claim 1, further comprising:
a fourth thin film transistor having a drain connected to the pull-up node, a source connected to a first low voltage signal input terminal, a gate connected to a reset signal input terminal or the pull-down node.

10. The shift register unit of claim 1, further comprising:
a sixth thin film transistor having a drain connected to the pull-down node, a source connected to the first low voltage signal input terminal, a gate connected to a signal input terminal or the pull-up node.

11. The shift register unit of claim 1, further comprising a first capacitor, whose two ends are connected to a gate of the first thin film transistor and the signal output terminal, respectively.

12. The shift register unit of claim 11, further comprising a second capacitor, whose two ends are connected to the pull-down node and the second low voltage signal input terminal, respectively.

13. A gate drive device for a liquid crystal display, comprising a plurality of shift register units according to claim 1, deposited on an array substrate of the liquid crystal display;
wherein except for a first shift register unit and a last shift register unit, a signal output terminal of each of the shift register units is connected to a signal input terminal of a next adjacent shift register unit and a reset signal input terminal of a previous adjacent shift register unit, a signal output terminal of the first shift register unit is connected to a signal input terminal of a second shift register unit, a signal output terminal of the last shift register unit is connected to a reset signal input terminal of a previous adjacent shift register unit and a reset signal input terminal of itself;
a signal input terminal of the first shift register unit inputs a frame start signal;
a first clock signal input terminal of an odd-numbered shift register unit inputs a first clock signal; a first clock signal input terminal of an even-numbered shift register unit inputs a second clock signal;
a low voltage signal input terminal of each shift register unit inputs a low voltage signal; and
a high voltage signal input terminal of each shift register unit inputs a high voltage signal.

14. The gate drive device for a liquid crystal display of claim 13, in the shift register unit,
a drain of the first thin film transistor is connected to the first clock signal input terminal, a source thereof is connected to the signal output terminal, and a gate thereof is connected to the pull-up node;
a drain of the third thin film transistor is connected to a signal input terminal, a source thereof is connected to the pull-up node, and a gate thereof is connected to the signal input terminal or the second clock signal input terminal;
a drain of the eleventh thin film transistor is connected to the pull-down node, a source thereof is connected to the first low voltage signal input terminal, and a gate thereof is connected to the signal output terminal.

15. The gate drive device for a liquid crystal display of claim 13, wherein the shift register unit further comprises a first level output unit for outputting the first level signal to the pull-up node under the control of the level at the pull-down node.

16. The gate drive device for a liquid crystal display of claim 13, wherein a threshold voltage of the eighth thin film transistor is equal to or less than a threshold voltage of the tenth thin film transistor.

17. The gate drive device for a liquid crystal display of claim 15, in the shift register unit, wherein the first level output unit comprises a ninth thin film transistor having a drain connected to the pull-up node, a gate connected to the pull-down node, and a source connected to a first low voltage signal input terminal, wherein a threshold voltage of the ninth thin film transistor is equal to or less than a threshold voltage of the tenth thin film transistor.

18. The gate drive device for a liquid crystal display of claim 13, in the shift register unit, wherein the control unit comprises:
   a fifth thin film transistor having a drain connected to a high voltage signal input terminal or a second clock signal input terminal, a gate connected to a reset signal input terminal or the second clock signal input terminal, and a source connected to the pull-down node.

19. The gate drive device for a liquid crystal display of claim 13, in the shift register unit, wherein the control unit further comprises:
   a seventh thin film transistor having a drain connected to a high voltage signal input terminal or a second clock signal input terminal, a gate connected to the frame start signal input terminal or the second clock signal input terminal, and a source connected to the pull-down node.

* * * * *